(12) United States Patent
Byun et al.

(10) Patent No.: US 7,889,811 B2
(45) Date of Patent: Feb. 15, 2011

(54) DIGITAL LINEAR AMPLIFICATION WITH NONLINEAR COMPONENTS (LINC) TRANSMITTER

(75) Inventors: Sangjin Byun, Daejeon (KR); Kwanwoo Kim, Atlanta, GA (US); Kyutae Lim, Alpharetta, GA (US); Chang-Ho Lee, Marietta, GA (US); Haksun Kim, Daejeon (KR); Joy Laskar, Marietta, GA (US)

(73) Assignees: Samsung Electro-Mechanics (KR); Georgia Tech Research Corporation, Atlanta, GA (US)

( * ) Notice: Subject to any disclaimer, the term of this patent is extended or adjusted under 35 U.S.C. 154(b) by 603 days.

(21) Appl. No.: 11/851,007

(22) Filed: Sep. 6, 2007

(65) Prior Publication Data
US 2009/0067541 A1 Mar. 12, 2009

(51) Int. Cl.
*H04L 25/03* (2006.01)
*H04L 25/49* (2006.01)
*H04K 1/02* (2006.01)
(52) U.S. Cl. ........................ 375/297; 375/219; 375/295
(58) Field of Classification Search ................ 375/295, 375/297, 219
See application file for complete search history.

(56) References Cited
U.S. PATENT DOCUMENTS
4,584,541 A 4/1986 Nossen 5,901,346 A * 5/1999 Stengel et al. ............... 455/126
6,313,703 B1 11/2001 Wright et al.
6,560,296 B1 5/2003 Glas et al.
6,737,914 B2 5/2004 Gu
6,889,034 B1 5/2005 Dent
7,469,017 B2 * 12/2008 Granstrom et al. .......... 375/295
2004/0266365 A1 12/2004 Hasson et al.
2006/0291589 A1 12/2006 Eliezer et al.
2007/0149151 A1 6/2007 Kim et al.
2007/0182617 A1 8/2007 Eloranta et al.
2008/0037662 A1 2/2008 Ravi et al.

FOREIGN PATENT DOCUMENTS
KR 20040075468 A 8/2004

OTHER PUBLICATIONS
Search Report issued on Nov. 7, 2008 for UK Patent Application No. 0816357.8.
Office Action for Korean Application No. 10-2008-0087810 dated Jun. 28, 2010.
Office Action from German Patent Office for German Application No. 10 2008 045 570.9-31 dated Nov. 4, 2010.

* cited by examiner

*Primary Examiner*—Ted M Wang
(74) *Attorney, Agent, or Firm*—Sutherland Asbill & Brennan LLP

(57) ABSTRACT

Embodiments of the invention may provide for a digital LINC (linear amplification with nonlinear components) transmitter. The digital LINC transmitter may include a signal component separator, at least one digital delay modulator, a frequency synthesizer, at least one power amplifier, a power combiner, an antenna, and a mismatch compensator. Additionally, systems and methods may be provided for compensating for phase and amplitude mismatches between two signal paths.

20 Claims, 13 Drawing Sheets

DIGITAL LINEAR AMPLIFICATION WITH NONLINEAR COMPONENTS (LINC) TRANSMITTER

BACKGROUND OF THE INVENTION

I. Field of the Invention

Embodiments of the invention relate generally to digital linear amplification with nonlinear components (LINC) transmitters, and more particularly, to digital LINC transmitters that compensate for phase and amplitude mismatches between two signal paths.

II. Related Art

In recent communication systems, the necessity for efficient frequency spectrum usage leads to the use of modulation methods such as quadrature amplitude modulation (QAM), which modulates data not only on the phase but also on the amplitude of the carrier signal, and consequently generates a signal having non-constant envelope. To transmit a signal with a non-constant envelope, the systems typically use linear power amplifiers. However, linear power amplifiers are inefficient in power consumption. Alternatives to linear power amplifiers include non-linear power amplifiers, which are more efficient in terms of power usage. However, the use of non-linear power amplifiers for non-constant envelope signals generally requires linearization techniques such as back-off, predistortion, feedforward, feedback, envelope elimination and restoration (EER), linear amplification with nonlinear components (LINC) and so on. As for LINC, prior LINC systems have had much difficulty in handling amplitude and/or phase compensation due to the tight matching requirement between two signal pats for all the available channels, and accordingly have avoided the use of LINC transmitters.

SUMMARY OF THE INVENTION

Embodiments of the invention may provide for a digital linear amplification with nonlinear components (LINC) transmitter. A digital LINC transmitter in accordance with embodiments of the invention may provide for one or more of the following (i) splitting a non-constant envelope signal into two component signals having a constant envelope, (ii) amplifying each component signal by a non-linear amplifier, (iii) combining the two amplified component signals to generate an amplified non-constant envelope signal, and (iv) transmitting the non-constant envelope signal. Likewise, according to an embodiment of the invention, amplitude and phase mismatches on two signal paths may also be compensated for.

According to an example embodiment of the invention, there is a digital LINC transmitter. The digital LINC transmitter may include a signal component separator that separates a non-constant envelope signal into a first phase data signal and a second phase data signal, a frequency synthesizer that generates a plurality of clock signals, where the first data phase data signal specifies a first pair of the clock signals and where the second data signal specifies a second pair of the clock signals, and at least one digital delay modulator that generates a first component signal having a first constant envelope and a second component signal having a second constant envelope, where the first component signal is generated by adjusting a first phase between the first pair of clock signals based upon the first phase data signal, and where the second component signal is generated by adjusting a second phase between the second pair of clock signals based upon the second phase data signal. The digital LINC transmitter may also include at least one non-linear power amplifier that amplifies the first component signal and the second component signal to generate an amplified first component signal and an amplified second component signal, a power combiner that combines the first amplified component signal and the second amplified component signal to generate an output signal having a non-constant envelope, and a mismatch compensator that monitors the output signal to select at least one offset value, where the selected at least one offset value is provided to at least one of the signal component separator for phase adjustment and the non-linear power amplifier for gain adjustment.

According to another example embodiment of the invention, there is a method for a digital LINC transmitter. The method may include separating a non-constant envelope signal by a signal component separator into a first phase data signal and a second phase data signal and generating, by at least one digital delay modulator, a first component signal having a first constant envelope and a second component signal having a second constant envelope, where the first component signal and the second component signal are generated based at least in part upon the first data signal and the second phase data signal. The method may also include amplifying the first component signal and the second component signal by at least one non-linear amplifier to generate an amplified first component signal and an amplified second component signal, combining the first amplified component signal and the second amplified component signal to generate an output signal having a non-constant envelope, and monitoring the output signal to select a phase offset value and an amplitude offset value, where the selected at least one offset value is provided to at least one of the signal component separator for phase adjustment and the non-linear power amplifier for gain adjustment.

According to yet another example embodiment of the invention, there is a system. The system may include a signal component separator that separates a non-constant envelope signal into a first phase data signal and a second phase data signal and at least one digital delay modulator that generates a first component signal having a first constant envelope and a second component signal having a second constant envelope, where the first component signal and the second component signal are generated based at least in part upon the first data signal and the second phase data signal. The system may also include at least one non-linear amplifier that amplifies the first component signal and the second component signal to generate an amplified first component signal and an amplified second component signal. The system may further include means for combining the first amplified component signal and the second amplified component signal to generate an output signal having a non-constant envelope, and means for selecting a phase offset value and an amplitude offset value based at least in part on the output signal, where the selected at least one offset value is provided to at least one of the signal component separator for phase adjustment and the non-linear power amplifier for gain adjustment.

BRIEF DESCRIPTION OF THE DRAWINGS

Figure 1:
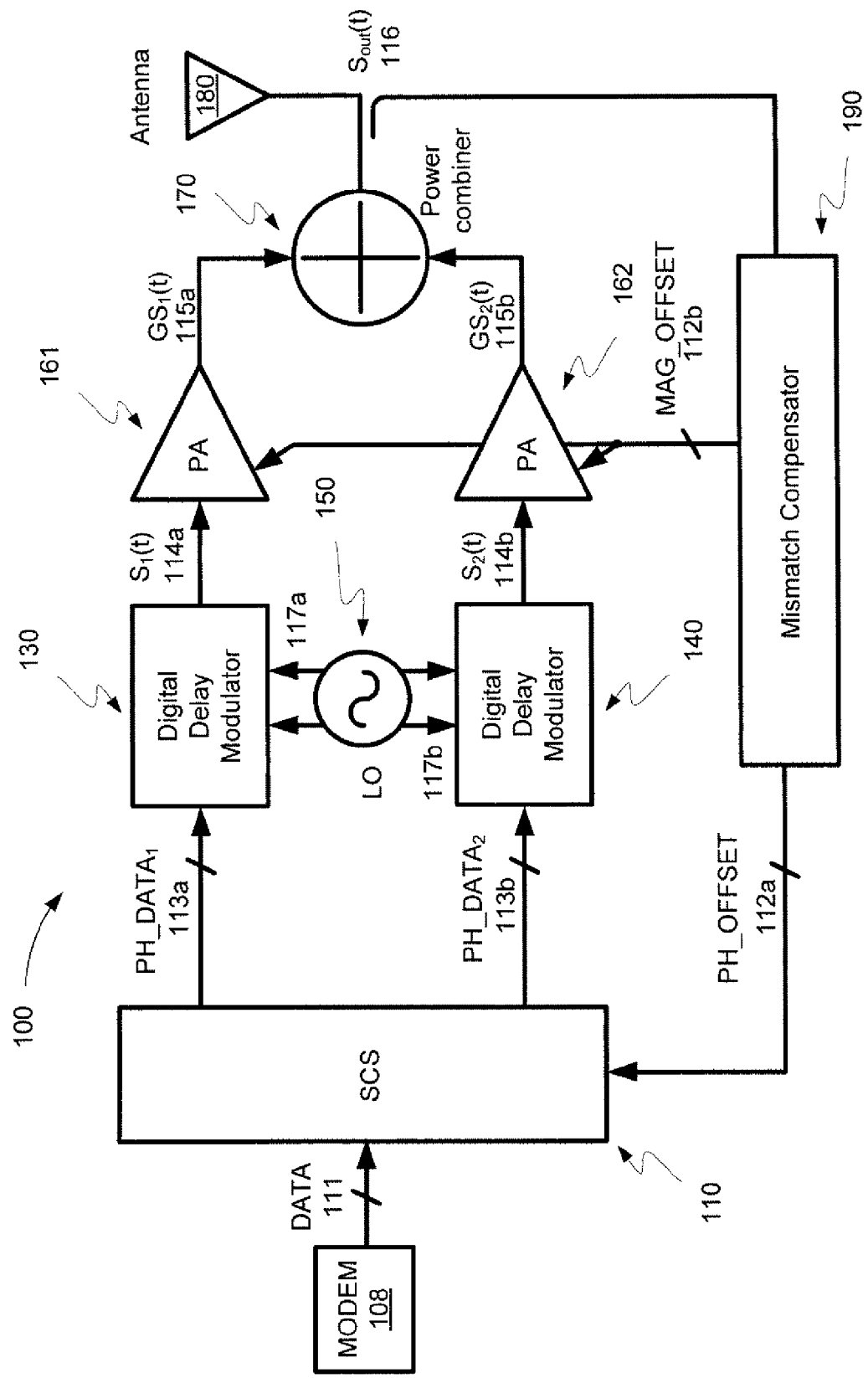

Having thus described the invention in general terms, reference will now be made to the accompanying drawings, which are not necessarily drawn to scale, and wherein:

FIG. 1 provides an example block diagram of a digital LINC transmitter having digital delay modulators, according to an example embodiment of the invention.

Figure 2:
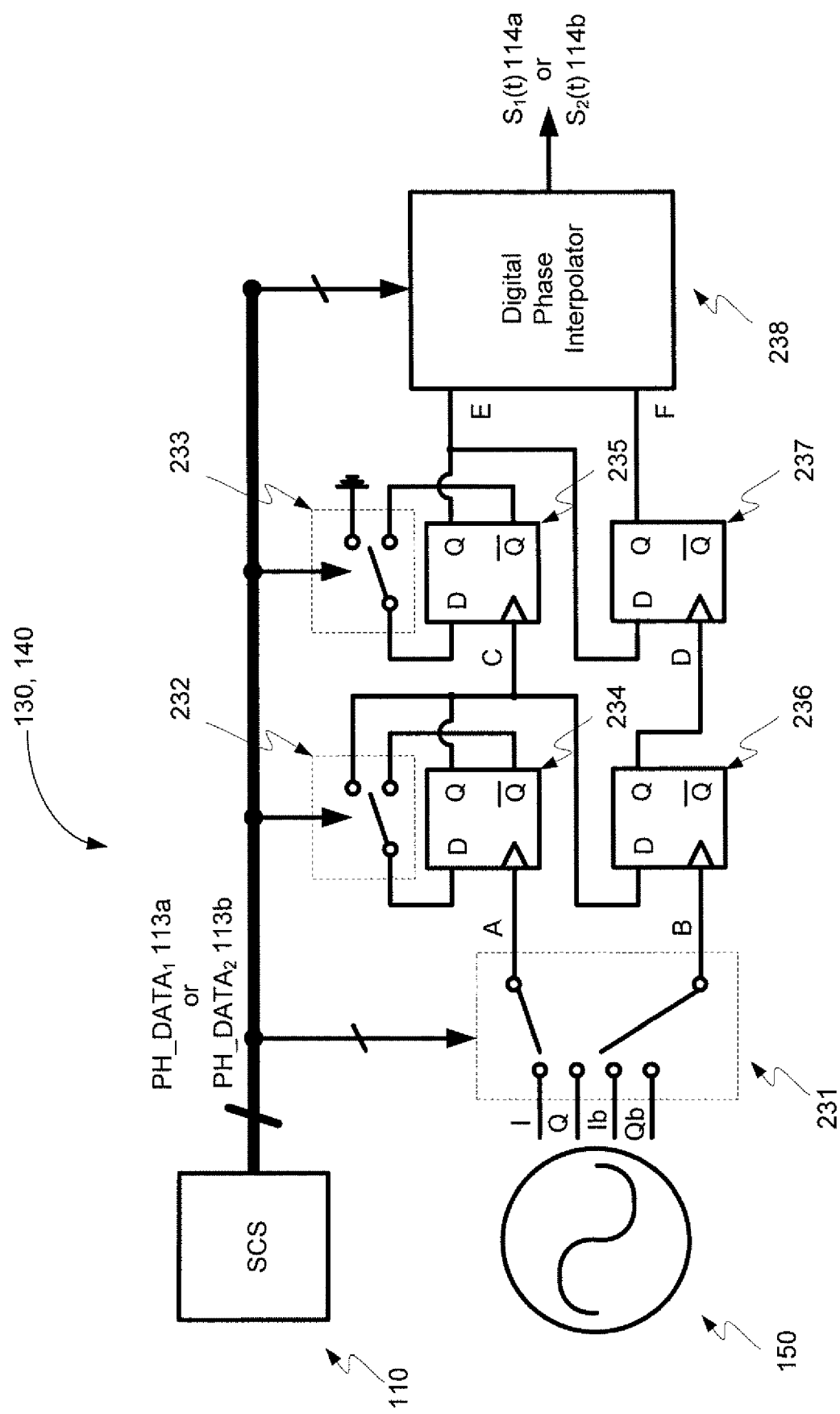

FIG. 2 provides an example block diagram of a digital delay modulator, according to an example embodiment of the invention.

Figure 3:
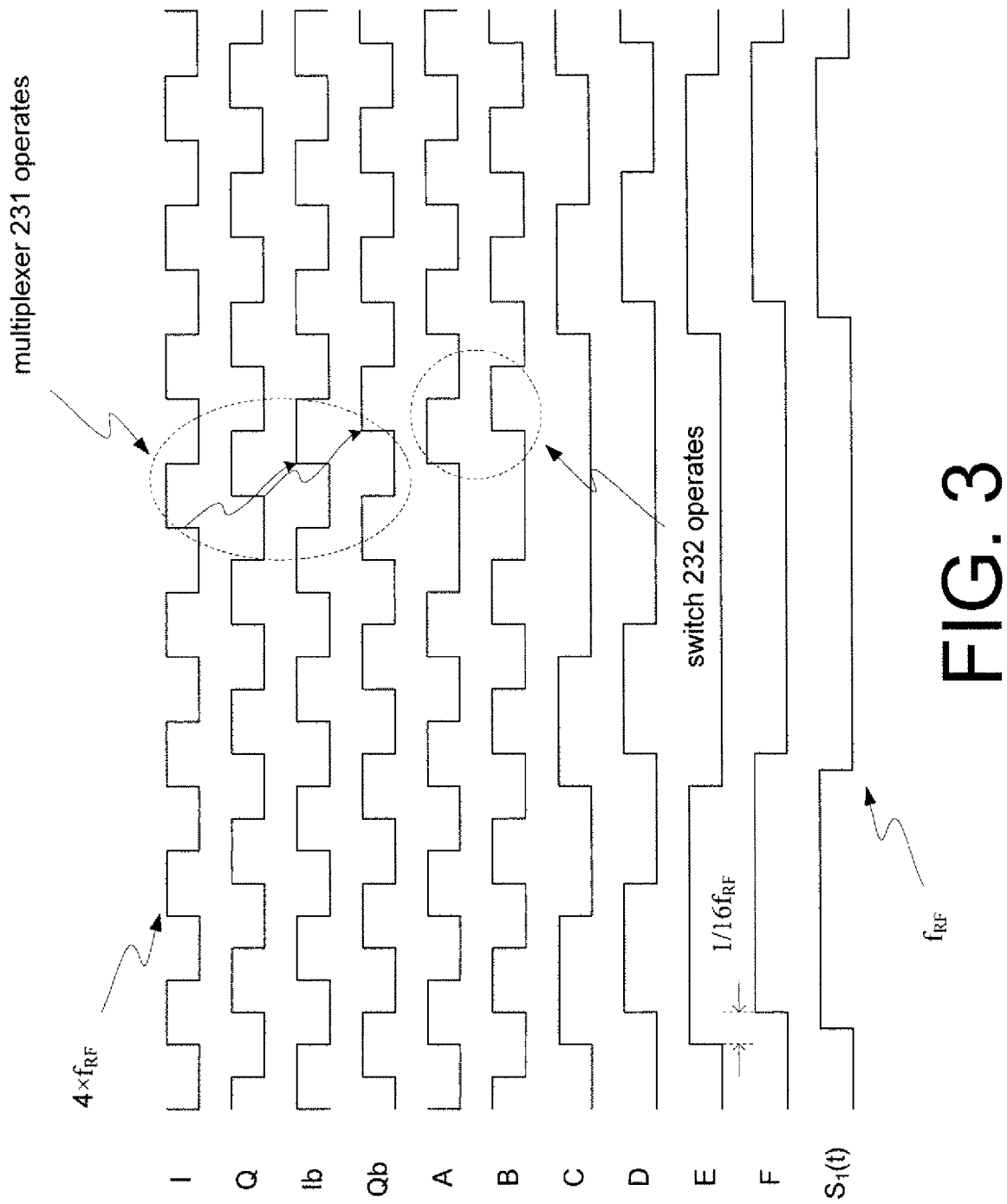

FIG. 3 illustrates an example timing diagram of an illustrative operation of the digital delay modulator of FIG. 2, according to an example embodiment of the invention.

Figure 4:
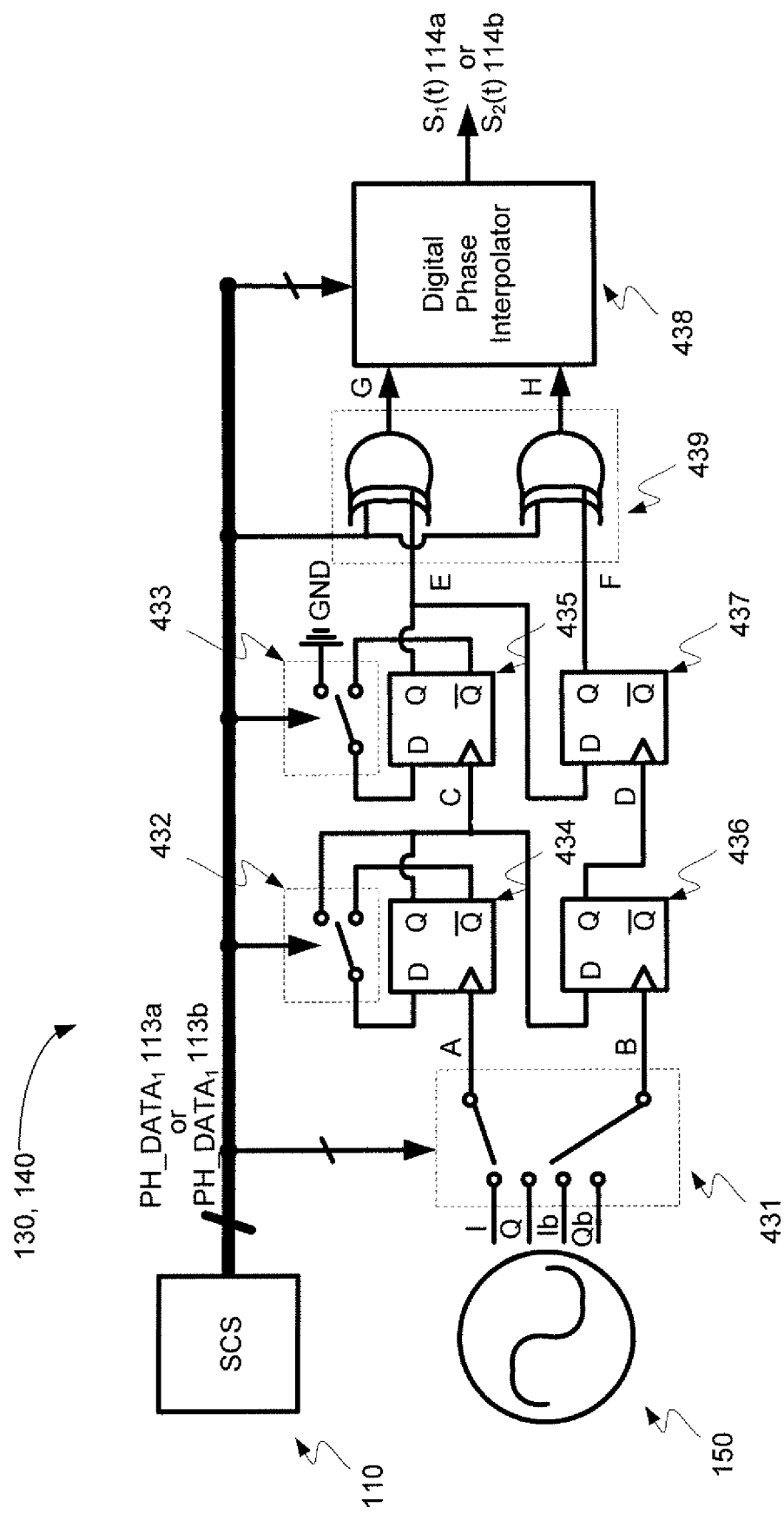

FIG. 4 provides an alternative block diagram of a digital delay modulator, according to an example embodiment of the invention.

Figure 5:
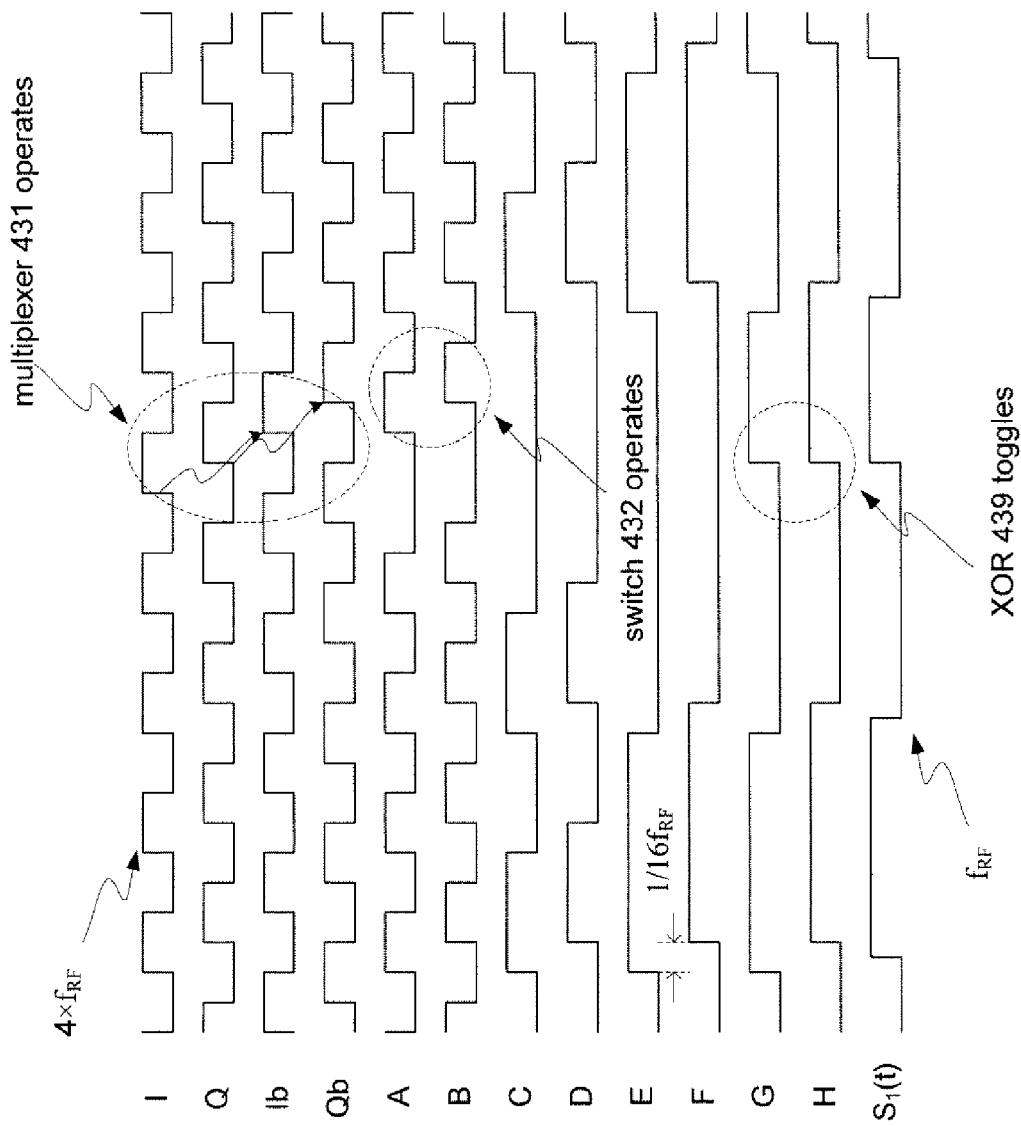

FIG. 5 illustrates an example timing diagram of an illustrative operation of the digital delay modulator of FIG. 4, according to an example embodiment of the invention.

Figure 6:
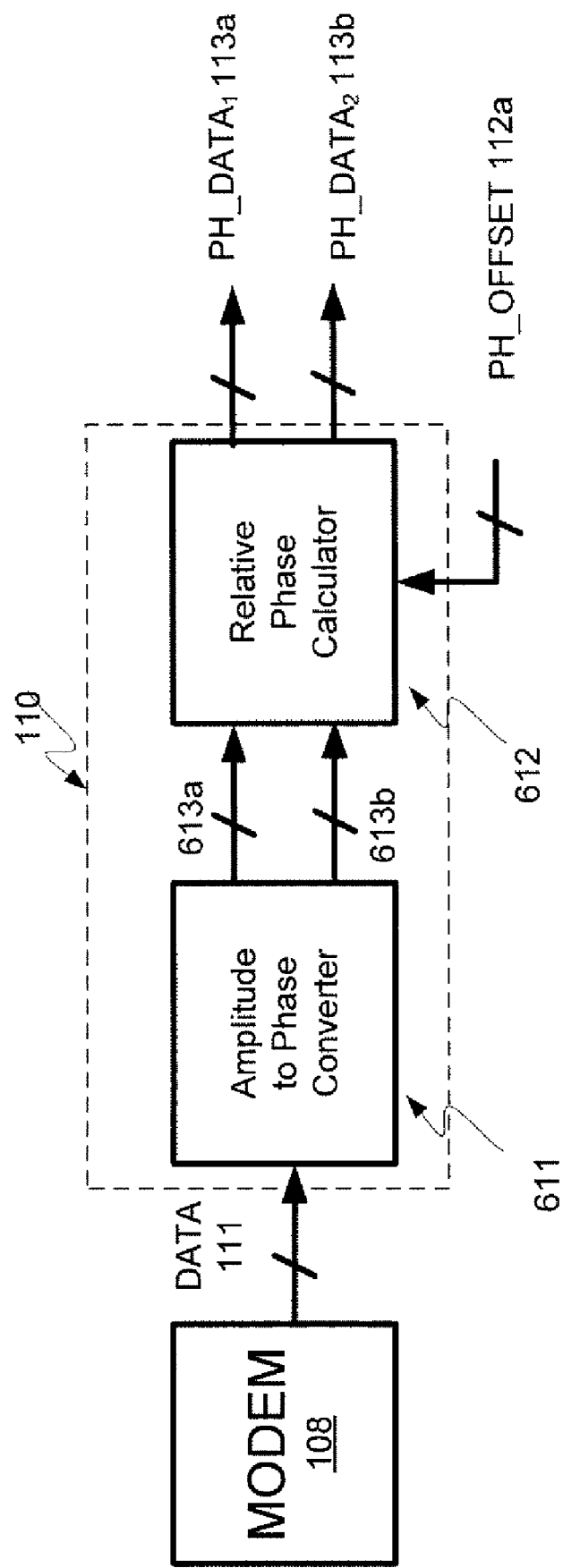

FIG. 6 provides an example block diagram of a signal component separator, according to an example embodiment of the invention.

Figure 7:
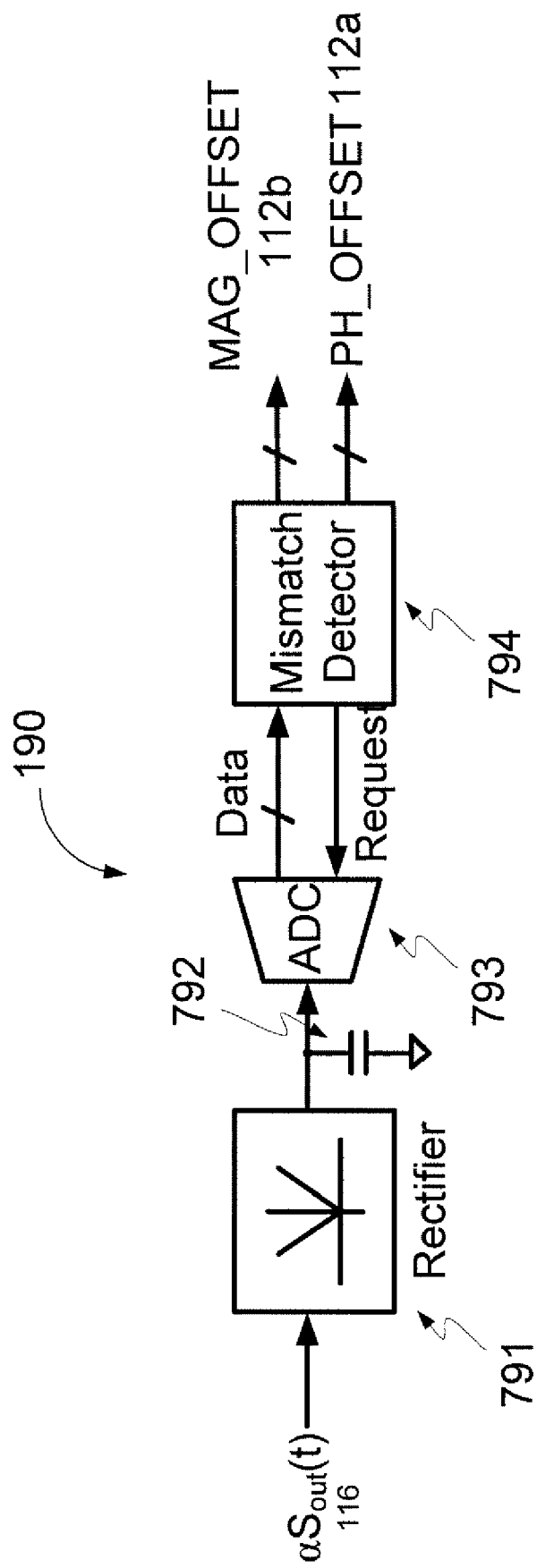

FIG. 7 provides an example block diagram illustrating a mismatch compensator, according to an example embodiment of the invention.

Figure 8:
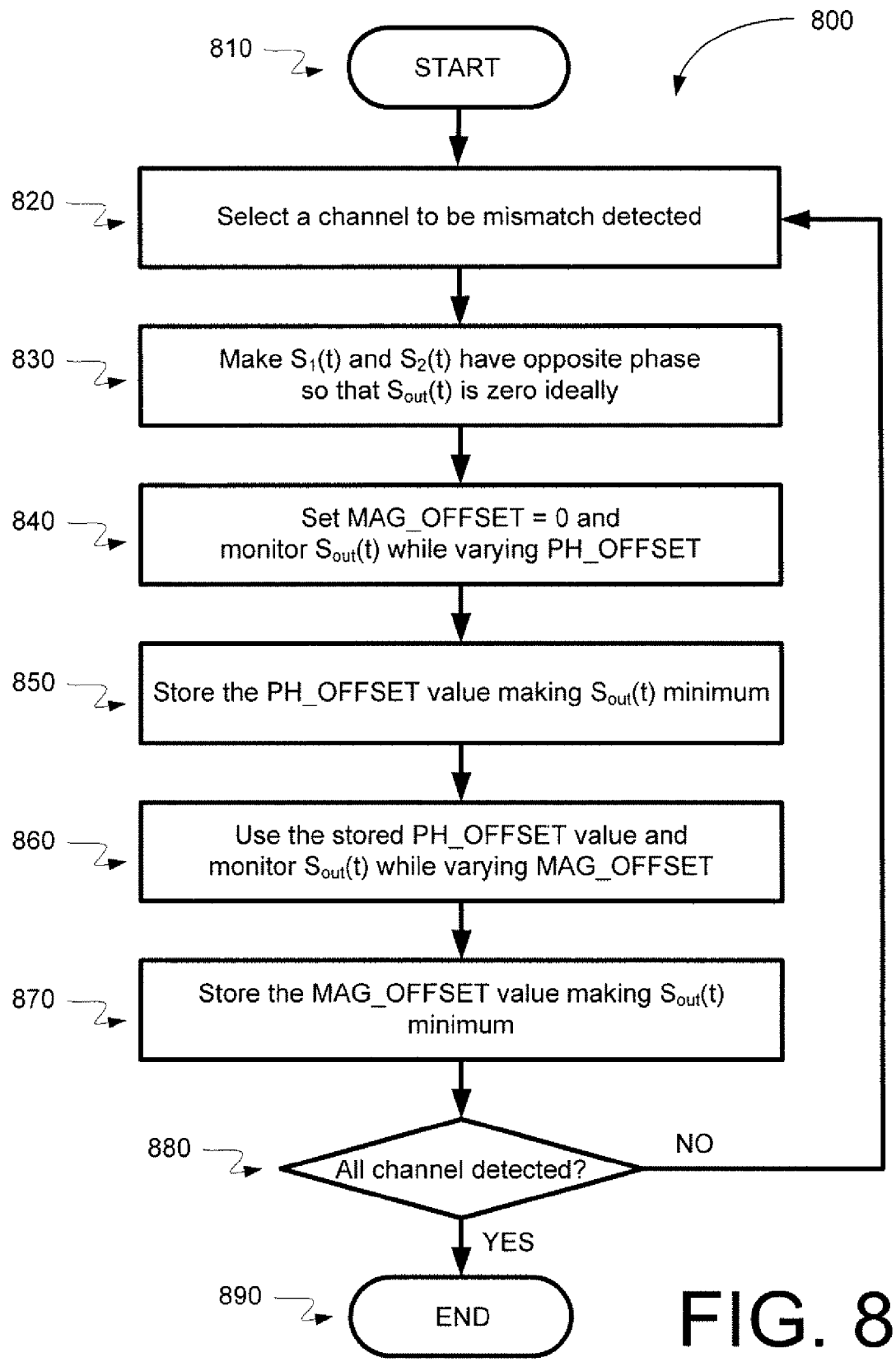

FIG. 8 provides an example flow diagram for detecting and compensating for phase and delay mismatches by a mismatch compensator, according to an example embodiment of the invention.

Figure 9:
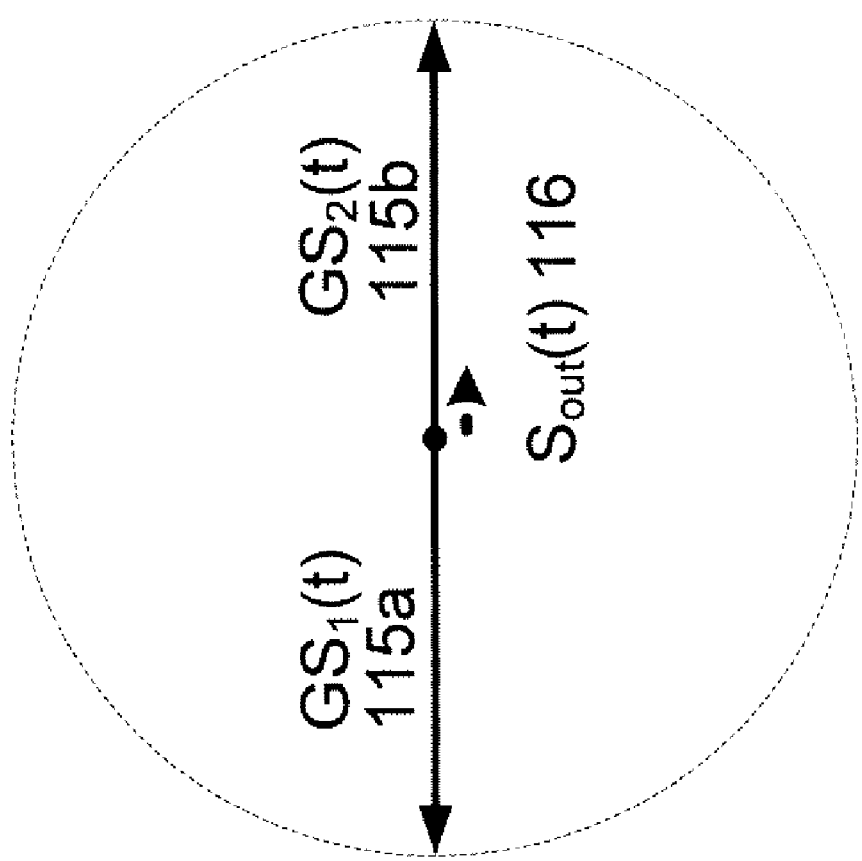

FIG. 9 illustrates example signal vectors in a digital LINC transmitter when there are no phase and amplitude mismatches between the two signal paths during a mismatch compensation procedure, according to an example embodiment of the invention.

Figure 10:
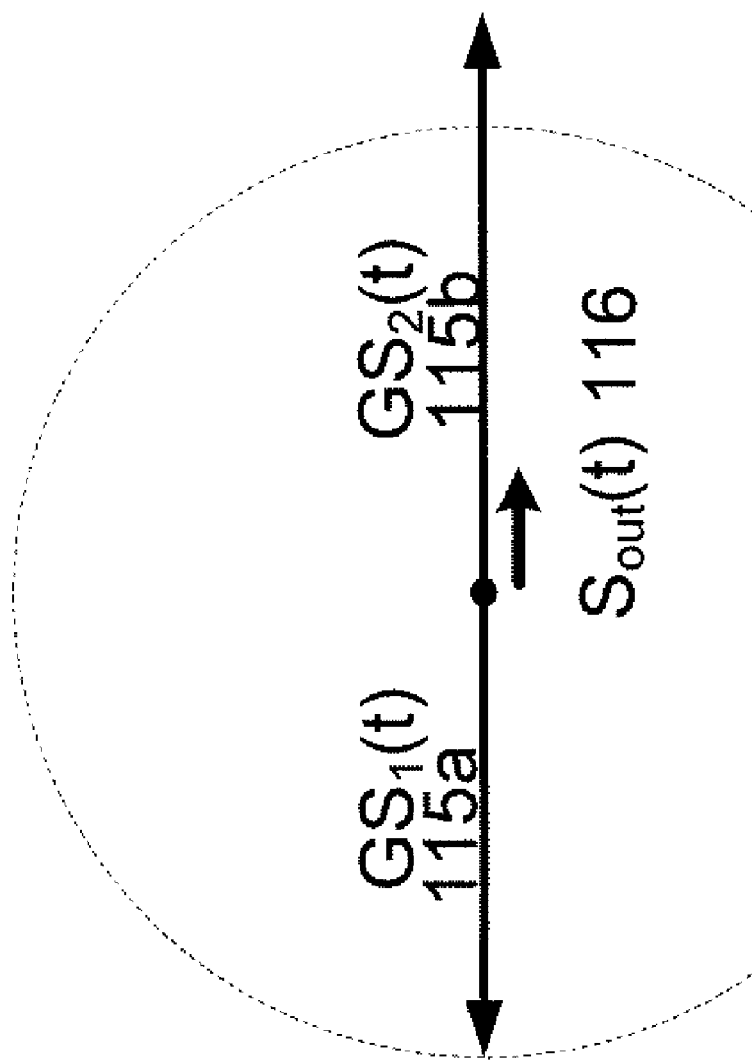

FIG. 10 illustrates example signal vectors in a digital LINC transmitter when there is only an amplitude mismatch between the two signal paths during a mismatch compensation procedure, according to an example embodiment of the invention.

Figure 11:
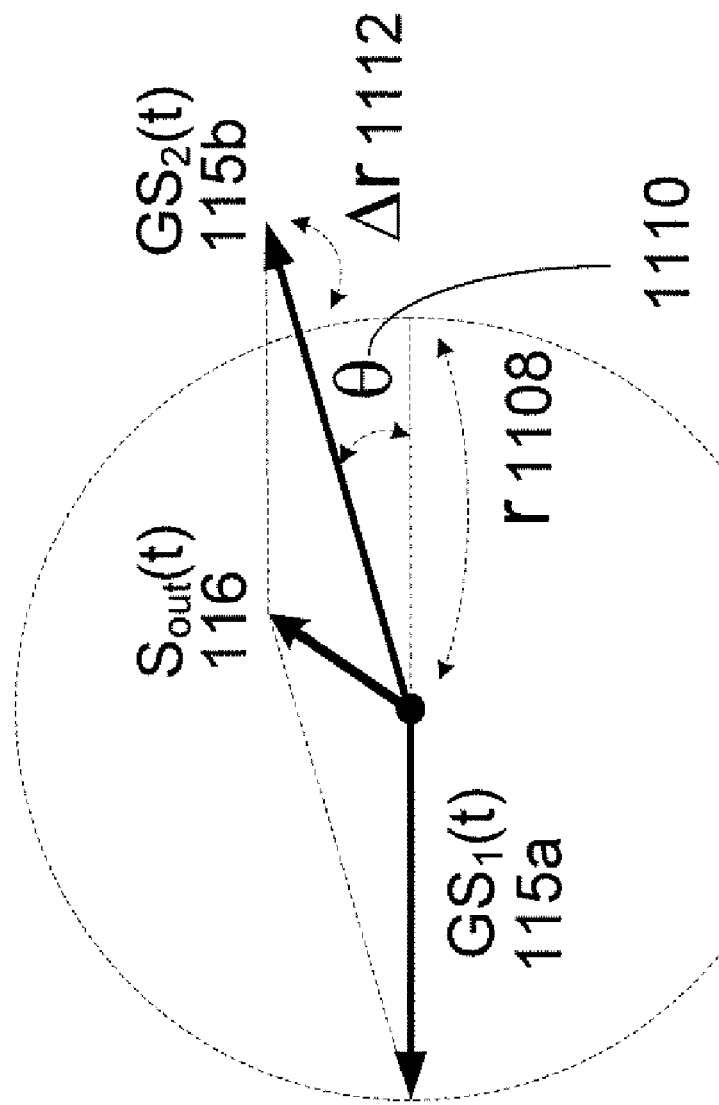

FIG. 11 illustrates example signal vectors in a digital LINC transmitter when there are both phase and amplitude mismatches between two signal paths during a mismatch compensation procedure, according to an example embodiment of the invention.

Figure 12:
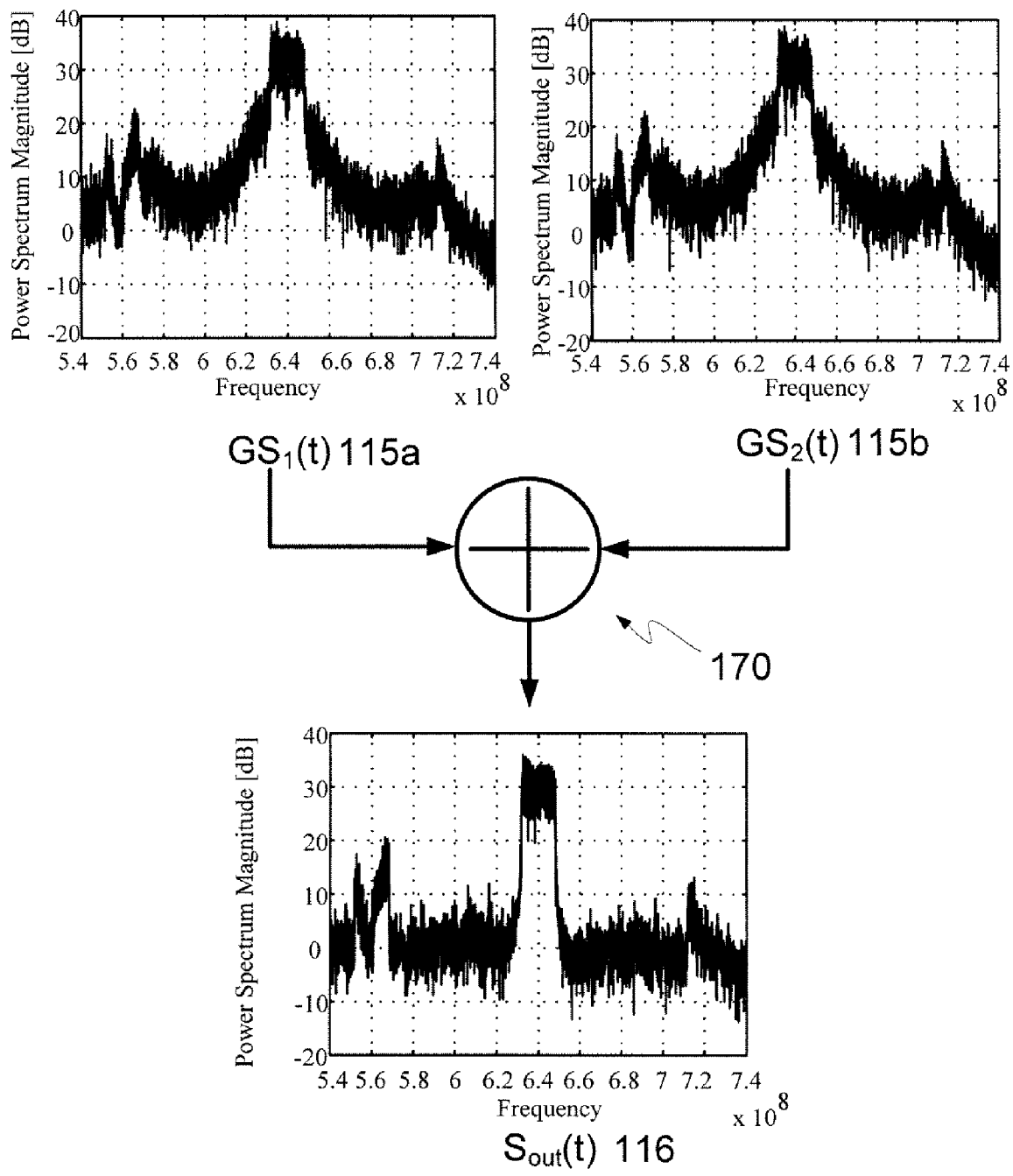

FIG. 12 illustrates simulated spectrums of example signals in a digital LINC transmitter that incorporates the digital delay modulator of FIG. 2, according to an example embodiment of the invention.

Figure 13:
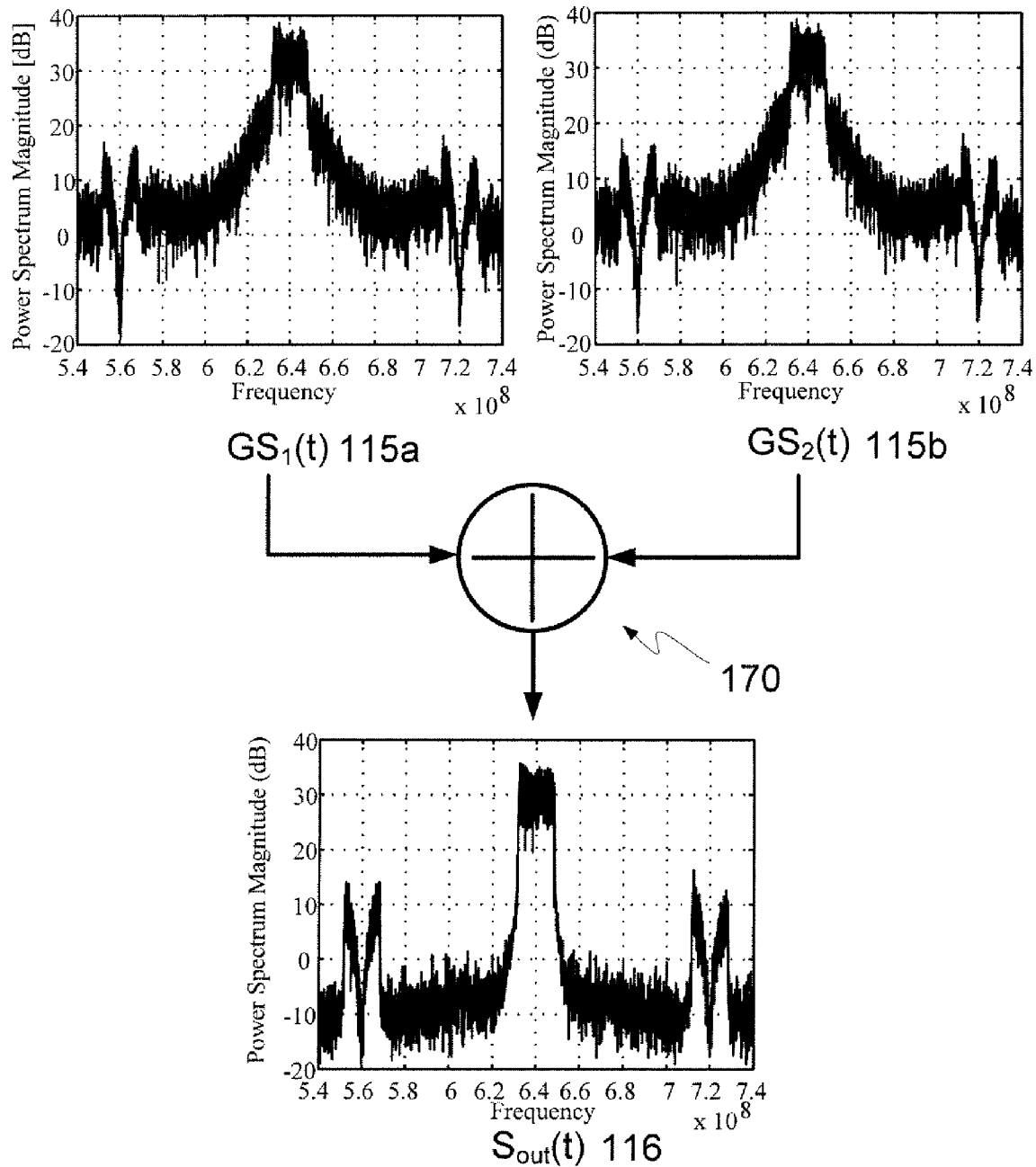

FIG. 13 illustrates simulated spectrums of example signals in a digital LINC transmitter that incorporates the digital delay modulator of FIG. 4, according to an example embodiment of the invention.

DETAILED DESCRIPTION OF THE INVENTION

Embodiments of the present invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide for a digital linear amplification with nonlinear components (LINC) transmitter. A digital LINC transmitter in accordance with an embodiment of the invention may provide for one or more of the following (i) splitting a non-constant envelope signal into two component signals having a constant envelope, (ii) amplifying each component signal by a non-Linear amplifier, (iii) combining the two amplified component signals to regenerate an amplified non-constant envelope signal, and (iv) transmitting the non-constant envelope signal. Likewise, according to an embodiment of the invention, any amplitude and/or phase mismatches on two signal paths may also be compensated for.

FIG. 1 provides an overview of an example block diagram of a digital LINC transmitter 100, according to an example embodiment of the invention. In particular, the digital LINC transmitter 100 may include a signal component separator (SCS) 110, digital delay modulators 130 and 140, a frequency synthesizer 150, non-linear power amplifiers 161 and 162, a power combiner 170, an antenna 180, and a mismatch compensator 190, according to an example embodiment of the invention.

Referring to FIG. 1, the signal component separator 110 may receive data 111 in the form of a non-constant envelope signal from a MODEM 108. According to an embodiment of the invention, the non-constant envelope signal may be a QAM signal, although other types non-constant envelope signals may be received by the signal component separator 110 as well. In addition, the signal component separator 110 may receive a phase offset value 112a (PH_OFFSET) from a mismatch compensator 190. As will be described in further detail, the mismatch compensator 190 may determine any amplitude and/or phase mismatches from the output signal 116 ($S_{out}(t)$) and generate the phase offset value 112a (PH_OFFSET) and amplitude offset value 112b (MAG_OFFSET). Using the received data 111 and the phase offset value 112a (PH_OFFSET), the signal component separator 110 may generate a first phase data signal 113a (PH_DATA$_1$) on a first signal path and a second phase data signal 113b (PH_DATA$_2$) on a second signal path.

Still referring to FIG. 1, the frequency synthesizer 150 may generate and provide clock signals 117a, 117b to the respective digital delay modulators 130, 140 on the respective first and second signal paths. In an example embodiment of the invention, the clock signals 117a, 117b may be respective I- and Q-clock signals, which are generally 90 degrees out of phase from each other. In addition, the clock signals 117a, 117b may also be provided at a frequency that is higher, perhaps four times faster, than the carrier frequency of the transmitted output signal 116 ($S_{out}(t)$). The higher frequency of the clock signals 117a, 117b in comparison to the transmitted output signal 116 ($S_{out}(t)$) may provide the digital delay modulators 130, 140 with more control over the resolution of the added delay.

According to an example embodiment of the invention, if the carrier frequency of the transmitted signal 116 ($S_{out}(t)$) by the LINC transmitter 100 is 600 MHz, then the frequency synthesizer 150 may generate I/Q clock signals 117a, 117b with respective frequencies of 2.4 GHz. Likewise, according to another example embodiment of the invention, if the carrier frequency of the transmitted signal 116 ($S_{out}(t)$) by the LINC transmitter 100 is 2.50 Hz, then the frequency synthesizer 150 may generate I/Q clock signals 117a, 117b with respective frequencies of 10 GHz.

It will be appreciated that the frequency synthesizer 150 may generate the clock signals 117a, 117b (e.g., 2.4 GHz, 10 GHz, etc.) according to a variety of methods. For example, according to an example embodiment of the invention, the frequency synthesizer 150 may generate the clock signals 117a, 117b at 2.4 GHz by coupling two LC oscillators operating at 2.4 GHz. Likewise, to generate the clock signals 117a, 117b at 10 GHz, the frequency synthesizer 150 may couple two LC oscillators operating at 10 GHz. According to an alternative embodiment of the invention, the frequency synthesizer 150 may generate the clock signals 117a, 117b at 2.4 GHz by dividing a 4.8 GHz clock signal from a single 4.8 GHz LC oscillator. Similarly, to generate the clock signals 116, 117 at 10 GHz, the frequency synthesizer 150 may divide a 20 GHz clock signal from a single 20 GHz LC oscillator. However, it will be appreciated that various methods are available for the frequency synthesizer 150 to generate the clock signals 117a, 117b without departing from embodiments of the invention.

According to an embodiment of the invention, the clock signals 117a, 117b may also be provided to the respective digital delay modulators 130, 140 on the respective first and second signal paths at a frequency that may be four times faster than the carrier frequency of the transmitted output signal 116 ($S_{out}(t)$). As described above, the clock signals 117a, 117b may be I/Q clock signals according to an example embodiment of the invention. The digital delay modulators 130, 140 may modulate the received clock signals 117a, 117b, which may be at a frequency that is four times faster than the transmitted output signal 116 ($S_{out}(t)$) of the LINC transmitter 100, with respective phase data signals 113a (PH_DATA$_1$) and 113b (PH_DATA$_2$) received from the signal component separator 110. The digital delay modulators 130, 140 may then generate the component signals 114a ($S_1(t)$) and 114b ($S_2(t)$) having constant envelopes on the respective first and second signal paths.

Still referring to FIG. 1, the component signals 114a ($S_1(t)$) and 114b ($S_2(t)$) having constant envelopes may then be amplified through the power amplifiers 161, 162 on the respective first and second signal paths. According to an example embodiment of the invention, the power amplifiers 161, 162 may be power-efficient, non-linear amplifiers. Each of the power amplifiers 161, 162 may then generate amplified component signals 115a ($GS_1(t)$) and 115b ($GS_2(t)$) on the respective first and second signal paths. A power combiner 170 may then combine, add, or otherwise merge the amplified component signals 115a ($GS_1(t)$) and 115b ($GS_2(t)$) on the respective first and second signal paths into a single, combined output signal 116 ($S_{out}(t)$), which may be transmitted via the antenna 180 and provided to the mismatch compensator 190.

As will be described in further detail below, the mismatch compensator 190 may analyze and process the output signal 116 ($S_{out}(t)$) to determine any phase mismatches and/or amplitude mismatches, and generate a phase offset value 112a (PH_OFFSET) and an amplitude offset value 112b (MAG_OFFSET). The phase offset value 112a (PH_OFFSET) may be provided to the signal component separator 110 while the amplitude offset value 112b (MAG_OFFSET) may be provided to power amplifiers 161, 162. According to an embodiment of the invention, each power amplifier 161, 162 may have a power gain that is digitally controllable or configurable according to the amplitude offset value 112b (MAG_OFFSET) received from the mismatch compensator 190.

FIG. 2 provides an example block diagram of a digital delay modulator 130, 140 of FIG. 1, according to an example embodiment of the invention. Turning now to FIG. 2, each digital delay modulator 130, 140 may include at least one multiplexer (MUX) 231; one or more switches 232, 233; one or more flipflops 234, 235, 236, 237; and at least one digital phase interpolator 238. According to an example embodiment of the invention, the multiplexer (MUX) 231 may be a 4-2 MUX and the flipflops 234, 235, 236, 237 may be clocked D flipflops. It will be appreciated that the multiplexer 231 may alternatively be replaced by one or more switches without departing from embodiments of the invention. Likewise, it will be appreciated that the flipflops 234, 235, 236, 237 may be replaced by memory cells, shift registers, and the like without departing from embodiments of the invention.

During operation of the digital delay modulator 130, 140, each multiplexer 231 may select two clock signals from a plurality of clock signals according to the phase data signal 113a (PH_DATA$_1$) or 113b (PH_DATA$_2$) received from the signal component separator 110 based upon the received phase data signal 113a (PH_DATA$_1$) or 113b (PH_DATA$_2$). According to an example embodiment of the invention, each respective multiplexer 231 may select two clock signals from four clock signals, including (1) an I signal, (2) a Q signal, (3) an Ib signal, and (4) a Qb signal. The I signal may be 90 degrees out of phase from the Q signal. The Ib signal may be 180 degrees out of the phase from the I signal. Likewise, the Qb signal may be 180 degrees out of phase from the Q signal. Each of the four clock signals may also operate a frequency that is four times faster than the transmitted output signal ($S_{out}(t)$) from the LINC transmitter 100.

As described above, the multiplexer 231 may receive phase data signal 113a (PH_DATA$_1$) or 113b (PH_DATA$_2$) from the signal component separator 110. According to an embodiment of the invention, two bits of the data signal 113a (PH_DATA$_1$) or 113b (PH_DATA$_2$) may be provided to the multiplexer 231 for selecting the pair of clock signals. Once the multiplexer 231 selects the pair of clock signals, the selected pair of clock signals may be provided to flipflops 234, 236 (e.g., D flipflops) as clock signals A, B, respectively. The flipflops 234, 236 may generate output port Q signals that are input into flipflops 235, 237 (e.g., D flipflops) as respective clock signals C, D. The flipflops 235, 237 may then generate respective output port Q signals that are provided as respective output signals E, F to the digital phase interpolator 238. The digital interpolator may then process the received output signals E, F and generate a respective one of the two component signals 114a ($S_1(t)$) and 114b ($S_2(t)$).

As introduced above, each digital delay modulator 130, 140 may include switches 232, 233. The switch 232 may be operative at a first position or at a second position according to the phase data signal 113a (PH_DATA$_1$) or 113b (PH_DATA$_2$) received from the signal component separator 110. According to an embodiment of the invention, the phase data signal 113a (PH_DATA$_1$) or 113b (PH_DATA$_2$) may include 1 bit for selecting between the first position and the second position of the switch 232. The switch 232 may be operative at a first position to electrically connect the input port D of the flipflop 234 to an output port Q of the flipflop 234. Additionally, in this first position, the switch 232 may also electrically connect the input port D of the flipflop 236 to the electrically connected input and output ports D, Q of the flipflop 234. Alternatively, the switch 232 may be operative in a second position to electrically connect the input port D of the flip lop 234 to the inverted output port $\overline{Q}$ of the flipflop 234. Using these two positions, the switch 232 may operate to digitally control the delay of the clock signals received from the frequency synthesizer 150.

The switch 233 may also be operative at a first position or at a second position according to the phase data signal 113a (PH_DATA$_1$) or 113b (PH_DATA$_2$) received from the signal component separator 110. According to an embodiment of the invention, the phase data signal 113a (PH_DATA$_1$) or 113b (PH_DATA$_2$) may include 1 bit for selecting between the first position and the second position of the switch 233. The switch 233 may be operative in a first position to electrically connect the input port D of the flipflop 235 to the inverted output port $\overline{Q}$ of the flipflop 235. Alternatively, the switch 233 may be operative in a second position to electrically connect the input port D of the flipflop 235 to a ground voltage GND. Using these two positions, the switch 233 may operate as a reset for the digital delay modulator 130 or 140.

As described above, the flipflop 235 may generate an output clock signal E while the flipflop 237 may generate an output clock signal F. According to an example embodiment of the invention, the output signal E may lead the output signal F of the flipflop 237 by a time of approximately $1/16 f_{RF}$, as illustrated in the associated timing diagram of FIG. 3, where $f_{RF}$ is the frequency of the output signal 116 ($S_{out}(t)$). Still referring to FIG. 2, the digital phase interpolator 238 may receive the output signals E, F from the respective flipflops 235, 237. Based upon the phase data signal 113a (PH_DATA$_1$) or 113b (PH_DATA$_2$), the digital phase interpolator 238 may interpolate a phase between the two output clock signals E, F.

As an example, assume that the digital phase interpolator receives or otherwise utilizes three bits of the phase data signal 113a (PH_DATA$_1$) or 113b (PH_DATA$_2$) that are received by the digital phase interpolator 238 from the signal component separator 110. According to an example embodiment of the invention, if the three bits of the phase data signal 113a (PH_DATA$_1$) or 113b (PH_DATA$_2$) is "000", then the digital phase interpolator 238 may output the leading clock signal E. On the other hand, if the three bits of the phase data signal 113a (PH_DATA$_1$) or 113b (PH_DATA$_2$) is "111", then the digital phase interpolator (538) may output the lagging clock signal F. Additionally, if the three bits of the phase data signal 113a (PH_DATA$_1$) or 113b (PH_DATA$_2$) is some value between "000" and "111", then the digital phase interpolator 238 may output a clock signal in which the phase is interpolated, perhaps linearly, between the leading clock signal E and the lagging clock signal F.

As described above, the phase data signal 113a (PH_DATA$_1$) or 113b (PH_DATA$_2$) may include 7 bits, which comprise 2 bits for controlling the multiplexer 231, 1 bit for controlling the switch 232, 1 bit for controlling the switch 233, and 3 bits for controlling the digital phase interpolator 238. However, it will be appreciated that each phase data signal 113a (PH_DATA$_1$) or 113b (PH_DATA$_2$) may include fewer or more than 7 bits. For example, according to another example embodiment of the invention, the digital phase interpolator 238 may include more or less than 3 bits, depending on whether more or less resolution is desired for interpolating a phase between the clock signals E and F.

According to an example embodiment of the invention, if N bits are input to the digital phase interpolator 238, then the required number of bits for each phase data signal 113a (PH_DATA$_1$) or 113b (PH_DATA$_2$) received from the signal component separator may be N+4 if two bits are utilized for the multiplexer 131, two bits are utilized for switches 132, 133, and N bits are utilized for the digital phase interpolator 138. Accordingly, the minimum resolution of delay controlled by each digital delay modulator 130, 140 may be determined to be $$\frac{1}{2^{N+4} f_{RF}},$$

which is equivalent to $$\frac{2\pi}{2^{N+4} f_{RF}} \text{ (radian) and } \frac{360}{2^{N+4} f_{RF}} (°)$$

in phase domain. For example, if N=3 and $f_{RF}$=600 MHz, then the minimum resolution of delay controlled by the digital delay modulator 130, 140 may be $$\frac{1}{2^7 (600\,\text{MHz})} \approx 13\,\text{ps},$$

which is about 0.049 radian and 2.8° in phase domain.

FIG. 3 illustrates a timing diagram of the operation of the digital delay modulator 130, 140 in FIG. 2. As shown in FIG. 2, the operation of the multiplexer 231 and the switch 232 may impose a delay on the generated clock signals E and F. As described above, the clock signal E may lead the clock signal F by $1/16\, f_{RF}$.

FIG. 4 provides an example block diagram of an alternative digital delay modulator 130, 140, according to an example embodiment of the invention. In FIG. 4, each digital delay modulator 130, 140 may include at least one multiplexer (MUX) 431, switches 432, 433, one or more flipflops 434, 435, 436, 437, at least one exclusive-or (XOR) logic gate 439, and at least one digital phase interpolator 238. The digital delay modulator 130, 140 of FIG. 4 is similar to the digital delay modulator discussed in FIG. 2. However, the digital delay modulator 130, 140 of FIG. 4 additionally includes the XOR logic gate 439 that may invert the output clock signals E, F of the flipflops 435, 437 according to the phase data signal 113a (PH_DATA$_1$) or 113b (PH_DATA$_2$) received from the signal component separator 110. Generally, the XOR gate 439 that is added between the flipflops 435, 437 and the digital phase interpolator 438 may invert the output clock signals E, F of the respective flipflops 435, 4373 which becomes the input signals G. H to the digital phase interpolator 438.

According to an example embodiment of the invention, 1 bit may be provided for in the phase data signal 113a (PH_DATA$_1$) or 113b (PH_DATA$_2$) for controlling the XOR logic gate 439. Thus, in accordance with an example embodiment of the invention, the phase data signal 113a (PH_DATA$_1$) or 113b (PH_DATA$_2$) may include 8 bits, which comprise 2 bits for controlling the multiplexer 431, 1 bit for controlling the switch 432, 1 bit for controlling the switch 433, 1 bit for controlling the XOR logic gate 439, and 3 bits for controlling the digital phase interpolator 438. However, it will be appreciated that each phase data signal 113a (PH_DATA$_1$) or 113b (PH_DATA$_2$) may include fewer or more than 8 bits, as similarly described with respect to FIG. 4.

Assuming that three bits is input to the digital phase interpolator 438, then the required number of bits for each phase data signal 113a (PH_DATA$_1$) or 113b (PH_DATA$_2$) received from the signal component separator 110 is eight bits, which comprises 2 bits for controlling the multiplexer 431, 1 bit for controlling the switch 432, 1 bit for controlling the switch 433, 1 bit for controlling the XOR logic gate 439, and 3 bits for controlling the digital phase interpolator 438. According to an example embodiment of the invention, if N bits are input to the digital phase interpolator 438, then the required number of bits for each phase data signal (PH_DATA$_1$) or 113b (PH_DATA$_2$) received from the signal component separator 110 may be N+5 if two bits are utilized by the multiplexer 431, two bits are utilized for switches 432, 433, one bit is utilized for the XOR gate 439, and N bits are utilized for the digital phase interpolator 438. According to an example embodiment of the invention, the minimum resolution of delay controlled by the digital delay modulator 130, 140 may not improve with the added bit for the XOR logic gate 439 and may still be $$\frac{1}{2^{N+4}f_{RF}},$$

which is equivalent to $$\frac{2\pi}{2^{N+4}f_{RF}} \text{ (radian) and } \frac{360}{2^{N+4}f_{RF}} (^\circ)$$

in phase domain. For a detailed example, if N=3 and $f_{RF}$=600 MHz, then the minimum resolution of delay controlled by the digital delay modulator 130, 140 may be $$\frac{1}{2^7(600\,\text{MHz})} \approx 13\,\text{ps},$$

is about 0.049 radian and 2.8° in phase domain.

FIG. 5 illustrates a timing diagram of the operation of the digital delay modulator 130, 140 in FIG. 4. As shown in FIG. 5, operation of the multiplexer 431 and the switch 432 may impose a delay on the clock signals E and F. According to an embodiment of the invention, the clock signal E may lead the clock signal F by $\frac{1}{16}f_{RF}$. Likewise, the toggling of the XOR logic gate 439 may invert the respective E and F clock signals to generate signals G and H that are provided to the digital phase interpolator 438.

FIG. 6 provides an example block diagram of a signal component separator 110 of FIG. 1, according to an example embodiment of the invention. The signal component separator 110 may include an amplitude to phase converter 611 and a relative phase calculator 612. According to an example embodiment of the invention, the amplitude to phase converter 611 may receive an incoming input signal 111 (DATA) having a non-constant envelope from the MODEM 108. The amplitude to phase converter 611 may be operative to convert the received input signal 111 (DATA) with the non-constant envelope into two temporary phase data signals 613a, 613b, which are provided to the relative phase calculator 612. The relative phase calculator 612 may calculate relative phases of the two temporary phase data signals 613a, 613b. Having calculated the relative phases, the relative phase calculator 612 may shift the phases of the two temporary phase data signals 613a, 613b by an amount provided by the phase offset value 112a (PH_OFFSET) received from the mismatch compensator 190, thereby generating the two final phase data signals 113a (PH_DATA$_1$) and 113b (PH_DATA$_2$).

FIG. 7 is an example block diagram of a mismatch compensator 190 of FIG. 1, according to an example embodiment of the invention. The mismatch compensator 190 may be operative to detect and compensate for phase and delay mismatches between two signal paths, according to an example embodiment of the invention. As shown in FIG. 7, the mismatch compensator 190 may include a rectifier 791, a capacitor 792, an analog-to-digital converter (ADC) 793, and a mismatch detector 794. In the mismatch compensator 190, the transmitted output signal 116 (S$_{out}$(t)) by the LINC transmitter 100 may be received by the rectifier 791. According to an embodiment of the invention, the rectifier 791 may rectify (e.g., reverse the negative portions of) the transmitted signal 116 (S$_{out}$(t)), which is then low-pass filtered by a capacitor 792 or another filter, and converted to digital values by the ADC 793. The mismatch detector 794 may determine and generate the phase offset value 112a (PH_OFFSET) and amplitude offset value 112b (MAG_OFFSET) based upon the digital values output by the ADC 793. According to an example embodiment of the invention, the mismatch detector 794 may send a request to the ADC 793 prior to receiving the digital output values, thereby allowing the ADC 793 to be more power efficient.

FIG. 8 provides an example flow diagram for detecting and compensating for phase and delay mismatches between two signal paths, according to an example embodiment of the invention. In block 820, the frequency synthesizer 150 may be tuned to the channel that is to be mismatched compensated. In block 830, the signal component separator 110 may be configured to output two phase data signals 113a (PH_DATA$_1$) and 113b (PH_DATA$_2$), which when processed by respective digital delay modulators 130, 140, generate component signals 114a (S$_1$(t)) and 114b (S$_2$(t)) that are opposite in direction (180°) from each other. Based upon these component signals 114a (S$_1$(t)) and 114b (S$_2$(t)), a resulting output signal 116 (S$_{out}$(t)) may be output by the power combiner 170 and received by the mismatch compensator 190.

In block 840, the amplitude offset value 112b (MAG_OFFSET) output by the mismatch compensator 190 may be set and held to an initialized value (e.g., zero). The mismatch compensator 190 may then vary the phase offset value 112a (PH_OFFSET) while the mismatch detector 794 monitors the digitized output values of the ADC 793 to determine the phase offset value 112a (PH_OFFSET) that minimizes the magnitude of the digitized output values of the ADC 793 (and likewise the transmitted output signal 116 (S$_{out}$(t))). It will be appreciated that since component signals 114a (S$_1$(t)) and 114b (S$_2$(t)) are intended to be opposite in directions (180°), the determined phase offset value 112a (PH_OFFSET) that minimizes the digitized output values of the ADC 793 ensures that the component signals 114a (S$_1$(t)) and 114b (S$_2$(t)) are indeed in opposite directions.

In step 850, the phase offset value 112a (PH_OFFSET) that minimizes the digitized output values of the ADC 793 may be stored, perhaps in a memory. According to an example embodiment of the invention, the memory may be a volatile memory. However, other embodiments of the invention may utilize a non-volatile memory. In step 860, the phase offset value 112a (PH_OFFSET) may be set and held to the determined and stored value that minimizes the digitized output values of the ADC 793. The amplitude offset value 112b (MAG_OFFSET) may then be varied while the mismatch detector 794 monitors the digitized output value of the ADC 793 to determine the amplitude offset value 112b (MAG_OFFSET) that minimizes the magnitude of the digitized output value of the ADC 793 (and likewise the transmitted output signal 116 (S$_{out}$(t))). In block 870, the value of the amplitude offset value 112b (MAG_OFFSET) that minimizes the magnitude of the digitized output value of the ADC 793 may be stored in a memory, which may be a volatile or non-volatile memory, according to an example embodiment of the invention. As provided by block 880, blocks 820-870 in FIG. 8 may be repeated for any additional changes that are to be mismatched detected. Accordingly, the values of the amplitude offset value 112b (MAG_OFFSET) and the phase offset value 112a (PH_OFFSET) may be detected and stored for all the requested channels.

FIG. 9 illustrates example signal vectors in a digital LINC transmitter when there are no phase and amplitude mismatches between the two signal paths during a mismatch compensation procedure, according to an example embodiment of the invention. More specifically, FIG. 9 illustrates vectors of the amplified component signals 115a (GS$_1$(t)) and 115b (GS$_2$(t)) output from the respective power amplifiers 161, 162 as well as the output signal 116 (S$_{out}$(t)) of the power combiner 170 in a digital LINC transmitter 100 when there is no phase and amplitude mismatches between two signal paths. Because the two output signals (GS$_1$(t) and GS$_2$(t)) of the power amplifiers 161, 162 have equal magnitudes and opposite directions, they cancel each other to output zero power ideally. Likewise, the output signal 116 (S$_{out}$(t)) of the power combiner 170 would ideally have an output zero power. According to an example, embodiment of the invention, the amplitude offset value 112b (MAG_OFFSET) and the phase offset value 112a (PH_OFFSET) determined for a channel according to FIG. 8 may be utilized to eliminate amplitude and phase mismatches such that the output signal 116 (S$_{out}$(t)) of the power combiner 170 would ideally have an output zero power.

FIG. 10 illustrates example signal vectors where there is an amplitude, but not phase, mismatch between two signal paths during a mismatch compensation procedure, according to an example embodiment of the invention. More specifically, FIG. 10 illustrates vectors of the amplified component signals 115a (GS$_1$(t)) and 115b (GS$_2$(t)) output from the respective power amplifiers 161, 162 as well as the output signal 116 (S$_{out}$(t)) of the power combiner 170 in a digital LINC transmitter 100 when there is only an amplitude mismatch between the two signal paths. Because the two amplified component signals 115a (GS$_1$(t)) and 115b (GS$_2$(t)) of the power amplifiers 161, 162 have different amplitudes with opposite directions, the output signal 116 (S$_{out}$(t)) of the power combiner 170 is represented as the amplitude difference of two output signals (GS$_1$(t) and GS$_2$(t)) of the power amplifiers 161, 162. Accordingly, as illustrated in block 860 of FIG. 8, the amplitude offset value 112b (MAG_OFFSET) may be adjusted in this situation to adjust the gain of one or both of the power amplifiers 161, 162, thereby equalizing the amplitudes of the of two amplified component signals 115a (GS$_1$(t)) and 115b (GS$_2$(t)).

FIG. 11 illustrates example signal vectors where there are both phase and amplitude mismatches between two signal paths during a mismatch compensation procedure, according to an example embodiment of the invention. More specifically, FIG. 11 illustrates vectors of the amplified component signals 115a (GS$_1$(t)) and 115b (GS$_2$(t)) output from the respective power amplifiers 161, 162 as well as the output signal 116 (S$_{out}$(t)) of the power combiner 170 in a digital LINC transmitter 100 when there are both phase and amplitude mismatches between two signal paths. Because the amplified component signals 115a (GS$_1$(t)) and 115b (GS$_2$(t)) have both phase and amplitude mismatches, the output signal (S$_{out}$(t)) of the power combiner 170 may be represented as a vector summation of the output signal 116 (S$_{out}$(t)). According to an embodiment of the invention, the magnitude of the output signal 116 (S$_{out}$(t)) of the power combiner 170 may be calculated as shown below in equation (1). It will be appreciated that the magnitude of the output signal 116 (S$_{out}$(t)) of the power combiner 170 may have a minimum value (Δr 1112) when the phase offset (θ 1110) is 0. Therefore, the mismatch compensator 190 may first detect the phase offset (and determine the phase offset value 112a (PH_OFFSET)) between two signal paths and then detect the amplitude offset (and determine the amplitude offset value 112b (MAG_OFFSET)) between two signal paths, as illustrated in FIG. 8.

$$|S_{out}(t)| = \sqrt{[(r+\Delta)\cos\theta - r]^2 + [(r+\Delta r)\sin\theta]^2} \quad (1)$$
$$= \sqrt{(r+\Delta r)^2 + r^2 - 2r(r+\Delta r)\cos\theta}$$
$$= \sqrt{\Delta r^2 + 2r(r+\Delta r)(1-\cos\theta)} \geq \Delta r$$

FIG. 12 is a example diagram illustrating simulated spectrums of example signals in a digital LINC transmitter that incorporates the digital delay modulator of FIG. 2, according to an example embodiment of the invention. More specifically, FIG. 12 illustrates the amplified component signals 115a (GS$_1$(t)) and 115b (GS$_2$(t)) that are combined by a power combiner 170 to generate an output signal 116 (S$_{out}$(t)).

FIG. 13 is a example diagram illustrating simulated spectrums of example signals in a digital LINC transmitter that incorporates the digital delay modulator of FIG. 4, according to an example embodiment of the invention. More specifically, FIG. 13 illustrates the amplified component signals 115a(GS$_1$(t)) and 115b (GS$_2$(t)) that are combined by a power combiner 170 to generate an output signal 116 (S$_{out}$(t)).

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A digital linear amplification with non-linear components (LINC) transmitter, comprising:
   a signal component separator that separates a non-constant envelope signal into a first phase data signal and a second phase data signal;
   a frequency synthesizer that generates a plurality of clock signals, wherein the first phase data signal specifies a first pair of the clock signals and wherein the second phase data signal specifies a second pair of the clock signals;
   at least one digital delay modulator that generates a first component signal having a first constant envelope and a second component signal having a second constant envelope, wherein the first component signal is generated by dividing and digitally delaying the first pair of clock signals based upon the first phase data signal, and wherein the second component signal is generated by dividing and digitally delaying the second pair of clock signals based upon the second phase data signal;
   at least one non-linear power amplifier that amplifies the first component signal and the second component signal to generate an amplified first component signal and an amplified second component signal;
   a power combiner that combines the first amplified component signal and the second amplified component signal to generate an output signal having a non-constant envelope; and
   a mismatch compensator that monitors the output signal to select at least one offset value, wherein the selected at least one offset value is provided to at least one of the signal component separator for phase adjustment or the non-linear power amplifier for gain adjustment.

2. The transmitter of claim 1, further comprising:
an antenna for transmitting the output signal.

3. The transmitter of claim 1, wherein the at least one offset value includes a phase offset value for phase adjustment and an amplitude offset value for gain adjustment.

4. The transmitter of claim 3, wherein the first component signal and second component signal are 180 degrees opposite one another, and the mismatch compensator selects the phase offset value by:
initializing the amplitude offset value to be zero; and
rectifying the output signal;
digitizing the rectified output signal by an analog-to-digital converter to generate digitized output values;
varying the phase offset value until the digitized output values are at a first minimum; and
selecting the phase offset value that results in the digitized output values being at the first minimum.

5. The transmitter of claim 4, wherein the mismatch compensator selects the amplitude offset value by:
initializing the phase offset value that results in the digitized output values being at the first minimum;
varying the amplitude offset value until the digitized output values are at a second minimum;
selecting the amplitude offset value that results in the digitized output values being at the second minimum.

6. The transmitter of claim 1, wherein the signal component separator includes:
an amplitude to phase converter that converts the non-constant envelope signal into a first temporary phase data signal and a second temporary phase data signal; and
a relative phase calculator that generates the first phase data signal and the second phase data signal based upon the first temporary phase data signal, the second temporary phase data signal, and the at least one offset value.

7. The transmitter of claim 1, wherein the digital delay modulator includes at least one multiplexer, at least one switch, at least one flipflop, and a digital phase interpolator.

8. The transmitter of claim 1, wherein clock signals generated by the frequency synthesizer operate at a higher frequency than the output signal.

9. The transmitter of claim 1, wherein the mismatch compensator includes a rectifier, an analog to digital converter, and a mismatch detector.

10. A method for a digital linear amplification with non-linear components (LINC) transmitter, comprising:
separating a non-constant envelope signal by a signal component separator into a first phase data signal and a second phase data signal;
selecting a first pair of clock signals and a second pair of clock signals from a plurality of clock signals;
generating, by at least one digital delay modulator, a first component signal having a first constant envelope and a second component signal having a second constant envelope, wherein the first component signal is generated based at least in part on dividing and digitally delaying the first pair of clock signals that are based upon the first phase data signal and the second component signal is generated based at least in part on dividing and digitally delaying the second pair of clock signals that are based upon the second phase data signal;
amplifying the first component signal and the second component signal by at least one non-linear amplifier to generate an amplified first component signal and an amplified second component signal;
combining the first amplified component signal and the second amplified component signal to generate an output signal having a non-constant envelope; and
monitoring the output signal to select a phase offset value and an amplitude offset value, wherein the selected at least one offset value is provided to at least one of the signal component separator for phase adjustment or the non-linear power amplifier for gain adjustment.

11. The method of claim 10, wherein the at least one offset value includes a phase offset value that is provided to the signal component separator and an amplitude offset value that is provided to the non-linear power amplifier.

12. The method of claim 10, wherein the first component signal and second component signal are 180 degrees opposite one another, and the phase offset value is selected by:
initializing the amplitude offset value to be zero; and
rectifying the output signal;
digitizing the rectified output signal by an analog-to-digital converter to generate digitized output values;
varying the phase offset value until the digitized output values are at a first minimum; and
selecting the phase offset value that results in the digitized output values being at the first minimum.

13. The method of claim 12, wherein the amplitude offset signal is selected by:
initializing the phase offset value to be the selected phase offset value that results in the digitized output values being at the first minimum;
varying the amplitude offset value until the digitized output values are at a second minimum;
selecting the amplitude offset value that results in the digitized output values being at the second minimum.

14. The method of claim 10, further comprising transmitting the output signal via an antenna.

15. The method of claim 10, wherein the signal component separator includes:
an amplitude to phase converter that converts the non-constant envelope signal into a first temporary phase data signal and a second temporary phase data signal; and
a relative phase calculator that generates the first phase data signal and the second phase data signal based upon the first temporary phase data signal, the second temporary phase data signal, and the at least one offset value.

16. The method of claim 10, wherein the digital delay modulator includes at least one multiplexer, at least one switch, at least one flipflop, and a digital phase interpolator.

17. The method of claim 10, further comprising:
generating a plurality of clock signals,
wherein the first phase data signal specifies a first pair of the clock signals,
wherein the second phase data signal specifies a second pair of the clock signals,
wherein the first component signal is generated based at least in part upon the first pair of clock signals, and
wherein the second component signal is generated based at least in part upon the second pair of clock signals.

18. A system, comprising:
a signal component separator that separates a non-constant envelope signal into a first phase data signal and a second phase data signal;
at least one digital delay modulator that generates a first component signal having a first constant envelope and a second component signal having a second constant envelope, wherein the first component signal is generated based at least in part on dividing and digitally delaying a first pair of clock signals that are based upon the first phase data signal and the second component signal is generated based at least in part on dividing and digitally delaying a second pair of clock signals that are based upon the second phase data signal;

at least one non-linear amplifier that amplifies the first component signal and the second component signal to generate an amplified first component signal and an amplified second component signal;

means for combining the first amplified component signal and the second amplified component signal to generate an output signal having a non-constant envelope; and means for selecting a phase offset value and an amplitude offset value based at least in part on the output signal, wherein the selected at least one offset value is provided to at least one of the signal component separator for phase adjustment or the non-linear power amplifier for gain adjustment.

19. The system of claim 18, wherein the first component signal and second component signal are 180 degrees opposite one another, and the means selects the phase offset value:

initializing the amplitude offset value to be zero; and
rectifying the output signal;
digitizing the rectified output signal by an analog-to-digital converter to generate digitized output values;
varying the phase offset value until the digitized output values are at a first minimum; and
selecting the phase offset value that results in the digitized output values being at the first minimum.

20. The system of claim 19, wherein the means selects the amplitude offset signal by:

initializing the phase offset value to be the selected phase offset value that results in the digitized output values being at the first minimum;
varying the amplitude offset value until the digitized output values are at a second minimum;
selecting the amplitude offset value that results in the digitized output values being at the second minimum.

* * * * *